(12) United States Patent
Zhang et al.

(10) Patent No.: US 9,153,165 B2
(45) Date of Patent: Oct. 6, 2015

(54) OLED DISPLAY PANEL, DRIVING CIRCUIT, AND DRIVING METHOD

(71) Applicants: BOE TECHNOLOGY GROUP CO., LTD., Beijing (CN); BEIJING BOE DISPLAY TECHNOLOGY CO., LTD., Beijing (CN)

(72) Inventors: Chunbing Zhang, Beijing (CN); Zheng Wang, Beijing (CN)

( * ) Notice: Subject to any disclaimer, the term of this patent is extended or adjusted under 35 U.S.C. 154(b) by 52 days.

(21) Appl. No.: 14/076,721

(22) Filed: Nov. 11, 2013

(65) Prior Publication Data

US 2014/0132490 A1 May 15, 2014

(30) Foreign Application Priority Data

Nov. 12, 2012 (CN) .......................... 2012 1 0451317

(51) Int. Cl.
*G09G 3/30* (2006.01)
*G09G 3/32* (2006.01)
*H01L 27/32* (2006.01)
*H05B 33/12* (2006.01)

(52) U.S. Cl.
CPC .......... *G09G 3/3208* (2013.01); *H01L 27/3232* (2013.01); *H05B 33/12* (2013.01); *H01L 2251/5323* (2013.01)

(58) Field of Classification Search
CPC ........................... G02F 1/133305; G09G 3/30
USPC .................. 345/76, 87, 1.1, 176; 349/158
See application file for complete search history.

(56) References Cited

U.S. PATENT DOCUMENTS

| | | | |
|---|---|---|---|
| 6,486,606 B1 | 11/2002 | Ting | |
| 8,362,922 B2 * | 1/2013 | Kushi et al. | 340/905 |
| 2007/0064173 A1 * | 3/2007 | Chiu et al. | 349/69 |
| 2008/0198320 A1 * | 8/2008 | Chwu et al. | 349/158 |
| 2008/0303982 A1 | 12/2008 | Jin et al. | |
| 2010/0277439 A1 * | 11/2010 | Charlier et al. | 345/176 |
| 2011/0148944 A1 * | 6/2011 | Kobayashi | 345/690 |

FOREIGN PATENT DOCUMENTS

CN 202019419 U 10/2011

OTHER PUBLICATIONS

Chinese Search Report dated May 4, 2014 (2 pages).
Office Action from Chinese counterpart application CN201210451317.8 issued by the State Intellectual Property Office of China (SIPO) dated May 12, 2014. English Translation provided by Dragon Intellectual Property Law Firm.
Office Action from Chinese counterpart application CN201210451317.8 issued by the State Intellectual Property Office of China (SIPO) dated Dec. 2, 2014 with English Translation. Translation provided by Dragon Intellectual Property Law Firm.

* cited by examiner

*Primary Examiner* — Pegeman Karimi
(74) *Attorney, Agent, or Firm* — Harness, Dickey & Pierce, P.L.C.

(57) ABSTRACT

The present invention provides an OLED display panel, a driving circuit, and a driving method. The OLED display panel includes: a first transparent substrate and a second transparent substrate arranged opposite to each other; an OLED array formed on one face of the first transparent substrate facing the second transparent substrate, and an optical display array and a first optical film formed on the other face of the first transparent substrate; and a second optical film formed on one face of the second transparent substrate opposite to the first transparent substrate, and an optical display array formed on the other face of the second transparent substrate. The first and second optical films can be switched between a non-opaque status and an opaque status.

16 Claims, 3 Drawing Sheets

| I00 | I01 | I02 | ... | I0n |
|-----|-----|-----|-----|-----|
| I10 | I11 | I12 | ... | I1n |
| I20 | I21 | I22 | ... | I2n |
| ... | ... | ... | ... | ... |
| In0 | In1 | In2 | ... | Inn |

Fig. 5a

| I0n | ... | I02 | I01 | I00 |
|-----|-----|-----|-----|-----|
| I1n | ... | I12 | I11 | I10 |
| I2n | ... | I22 | I21 | I20 |
| ... | ... | ... | ... | ... |
| Inn | ... | In2 | In1 | In0 |

Fig. 5b

OLED DISPLAY PANEL, DRIVING CIRCUIT, AND DRIVING METHOD

CROSS REFERENCE

The present application claims priority to the Chinese application No. 201210451317.8 filed on Nov. 12, 2012, the entire contents of which are incorporated herein by reference.

TECHNICAL FIELD

The present invention relates to the field of organic light emitting diode (OLED) display, in particular to an OLED display panel, a driving circuit, and a driving method.

BACKGROUND

An OLED display panel consists of a glass substrate, an indium tin oxide (ITO) anode, an organic light-emitting material layer, and a metallic cathode, etc. The organic light-emitting material layer is sandwiched by the thin, transparent ITO anode and the metallic cathode. When a voltage is injected into holes of the anode and combined with electrons from the cathode at the organic light-emitting material layer, the organic materials included in the organic light-emitting material layer will be energized to emit light.

The OLED display panel has a wide application prospect due to the advantages such as simple manufacturing process, low cost, rapid response, low power consumption, wide range of operating temperature, small dimension and light weight, and convenience in realizing flexible display. However, generally the existing OLED display panel is merely used for single-sided display.

SUMMARY

An object of the present invention is to provide an OLED display panel, a driving circuit, a driving method and a display device, so as to realize double-sided display.

In one aspect, embodiments of the present invention provide an OLED display panel, comprising:

a first transparent substrate and a second transparent substrate arranged opposite to each other;

an OLED array formed on one face of the first transparent substrate facing the second transparent substrate, and an optical display array and a first optical film formed on the other face of the first transparent substrate; and a second optical film formed on the other face of the second transparent substrate opposite to the first transparent substrate, and an optical display array formed on the other face of the second transparent substrate, wherein the first and second optical films can be switched between a non-opaque status and an opaque status.

Further, the optical display array on the second transparent substrate is formed on one face facing the first transparent substrate.

Further, the optical display array includes a black matrix.

Further, the optical display array includes a color filter layer.

In another aspect, the present invention provides a driving circuit for an OLED display panel, comprising:

a data signal providing module, configured to provide a data current signal according to display data;

a controlling module, configured to, within a first clock cycle, directly output the data current signal to a data signal line of the OLED display panel and output a forward optical signal to a switching module, and within a second clock cycle, invert the data current signal, output the inverted data current signal to the data signal line, and output a backward optical signal to the switching module; and the switching module, configured to switch the first optical film to the non-opaque status and switch the second optical film to the opaque status when the forward optical signal is received, and to switch the first optical film to the opaque status and switch the second optical film to the non-opaque status when the backward optical signal is received.

Further, the data current signal has a frequency twice a frame frequency for frame transmission of the OLED display panel.

The controlling module is specifically configured to output the data current signal to the data signal line after an XOR operation is performed on the data current signal within the second clock cycle, and/or to reverse a scanning sequence of the data current signal within the second clock cycle and then output the data current signal to the data signal line.

In yet another aspect, the present invention further provides a driving method for an OLED display panel, comprising:

providing a data current signal according to display data; and within a first clock cycle, directly outputting the data current signal to a data signal line of the OLED display panel, switching a first optical film to the non-opaque status and switching a second optical film to the opaque status, and within a second clock cycle, inverting the data current signal, outputting the inverted data current signal to the data signal line, switching the first optical film to the opaque status, and switching the second optical film to the non-opaque status.

Further, the data current signal has a frequency twice a frame frequency for frame transmission of the OLED display panel.

Further, the inverting the data current signal within a second clock cycle comprises:

performing an XOR operation on the data current signal; and/or reversing a scanning sequence of the data current signal.

The present invention has the following beneficial effect.

According to the present invention, by means of a bi-directional light-emitting property of the OLED, the display panel is formed by two transparent substrates, and optical films capable of being switched between a non-opaque status and an opaque status are formed on the two surfaces of the display panel respectively. Because light can pass through the transparent substrates, it is able to realize both front and back display via an OLED array arranged on one of the transparent substrates, thereby to achieve double-sided display.

BRIEF DESCRIPTION OF THE DRAWINGS

FIG. 5a is a schematic view showing the charging current during the front display of the OLED display panel according to embodiments of the present invention; and FIG. 5b is a schematic view showing the charging current during the back display of the OLED display panel according to embodiments of the present invention.

| Reference signs | |
|---|---|
| 1: second optical film | 4: first optical film |
| 3: second transparent substrate | 2: first transparent substrate |

DETAILED DESCRIPTION

To make the technical problems, the technical solutions and the advantages of the present invention more apparent, the present invention is described hereinafter in conjunction with the drawings and the embodiments.

In order to solve the problem existing in the prior art that an OLED display panel is usually only used for single-sided display, the present invention provides an OLED display panel, a driving circuit, a driving method and a display device so as to achieve double-sided display of the OLED display panel.

Figure 1:
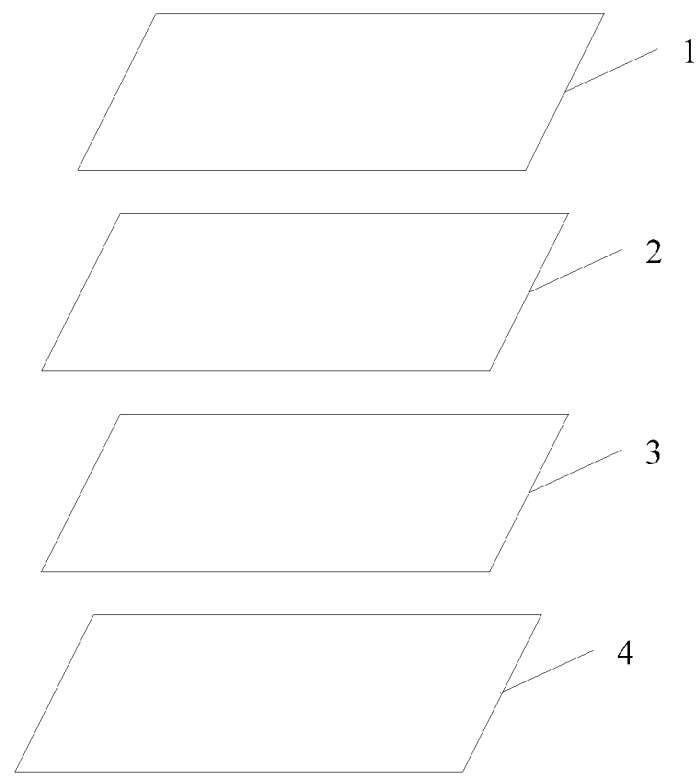
FIG. 1 is a schematic view showing the structure of an OLED display panel according to embodiments of the present invention.

As shown in FIG. 1, the OLED display panel comprises:

a first transparent substrate 3 an a second transparent substrate 2 arranged opposite to each other;

an OLED array (not shown) formed on one face of the first transparent substrate 3 facing the second transparent substrate 2, and an optical display array and a first optical film 4 formed on the other face of the first transparent substrate 3; and an optical display array formed on one face of the second transparent substrate 2, and a second optical film 1 formed on the other face of the second transparent substrate 2 opposite to the first transparent substrate 3, wherein the first optical film 4 and the second optical film 1 can be switched between a non-opaque status and an opaque status.

Further, the optical display array on the second transparent substrate 2 can be formed on one face facing or opposite to the first transparent substrate 3. Preferably, the optical display array on the second transparent substrate 2 is formed on one face facing the first transparent substrate 3, such that the second optical film 1 and the optical display array on the second transparent substrate 2 can be located on different faces of the second transparent substrate 2 without influencing each other.

Further, when the OLED array can emit color light, the optical display array may merely include a black matrix, and when the OLED array can merely emit white light, the optical display array may further include a color filter layer.

In this embodiment, when the OLED array on the second transparent substrate 3 emits light, because the light can pass through the first transparent substrate 3 and the second transparent substrate 2, it is able to see simultaneously the light from both the first transparent substrate 3 and the second transparent substrate 2, thereby to achieve simultaneous display.

According to the OLED display panel of the present invention, by means of a bi-directional luminescent characteristic of the OLED, the display panel is formed by two transparent substrates, and optical films capable of being switched between a non-opaque status and an opaque status are formed on the two surfaces of the display panel respectively. Because light can pass through the transparent substrates, it is able to realize both front and back display via an OLED array arranged on one of the transparent substrates, thereby to achieve double-sided display.

According to embodiments of the present invention, the present invention further provides a display device comprising the above-mentioned OLED display panel.

Figure 2:
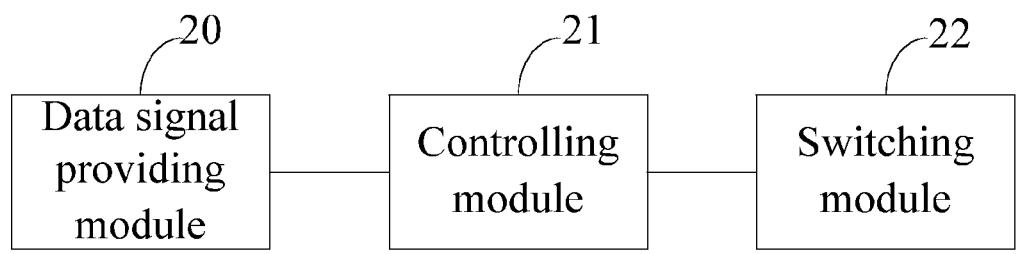
FIG. 2 is a block diagram of a driving circuit for driving the OLED display panel according to embodiments of the present invention.

According to embodiments of the present invention, the present invention further provides, as shown in FIG. 2, a driving circuit for an OLED display panel, the driving circuit comprising:

a data signal providing module 20, configured to provide a data current signal according to display data, the data current signal having a frequency twice a frame frequency for frame transmission of the OLED display panel, wherein the frame frequency for frame transmission of the OLED display panel is equal to or greater than 30 Hz, preferably, 60 Hz, 120 Hz, 240 Hz, etc;

a controlling module 21, configured to, within a first clock cycle, directly output the data current signal to a data signal line of the OLED display panel and output a forward optical signal to a switching module, and within a second clock cycle, invert the data current signal, output the inverted data current signal to the data signal line, and output a backward optical signal to the switching module; and the switching module 22, configured to switch the first optical film 4 to the non-opaque status and switch the second optical film 1 to the opaque status when the forward optical signal is received, and to switch the first optical film 4 to the opaque status and switch the second optical film 1 to the non-opaque status when the backward optical signal is received.

Further, the controlling module 21 is specifically configured to output the data current signal to the data signal line after an XOR operation is performed on the data current signal within the second clock cycle, and/or to reverse a scanning sequence of the data current signal within the second clock cycle and then output the data current signal to the data signal line.

Figure 3:
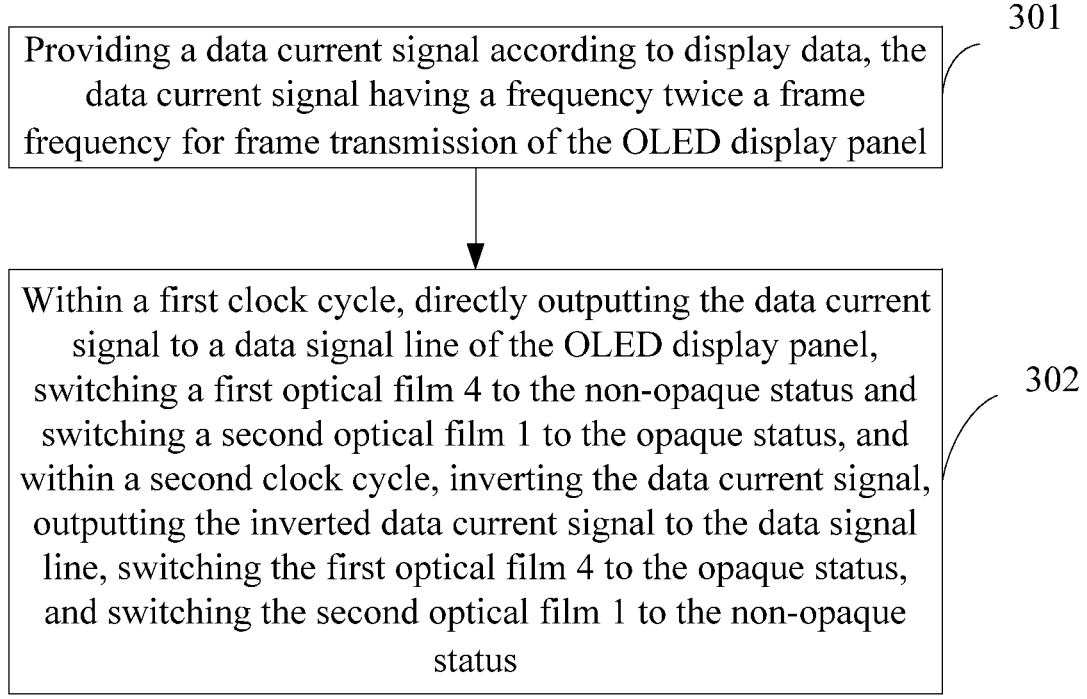
FIG. 3 is a flow chart of a driving method for the OLED display panel according to embodiments of the present invention.

In yet another embodiment, the present invention further provides, as shown in FIG. 3, a diving method for an OLED display panel, comprising:

Step 301: providing a data current signal according to display data, the data current signal having a frequency twice a frame frequency for frame transmission of the OLED display panel; and Step 302: within a first clock cycle, directly outputting the data current signal to a data signal line of the OLED display panel, switching a first optical film 4 to the non-opaque status and switching a second optical film 1 to the opaque status, and within a second clock cycle, inverting the data current signal, outputting the inverted data current signal to the data signal line, switching the first optical film 4 to the opaque status, and switching the second optical film 1 to the non-opaque status.

Further, in Step 302, the inverting the data current signal within a second clock cycle comprises: performing an XOR operation on the data current signal; and/or reversing a scanning sequence of the data current signal.

Figure 4:
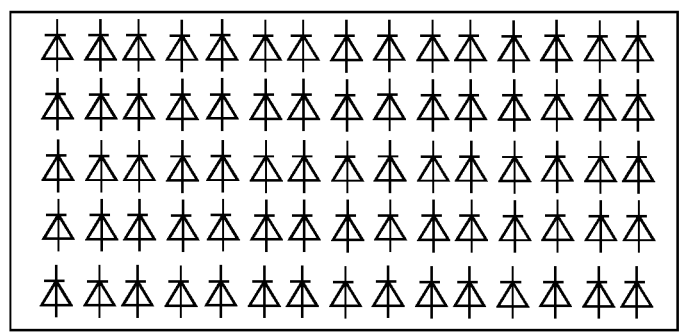
FIG. 4 is a schematic view showing an OLED array on a transparent substrate according to embodiments of the present invention.

The driving method for the OLED display panel will be described hereinafter in conjunction with FIGS. 4-5b.

The OLED display panel of the present invention is formed by the first transparent substrate 3 and the second transparent substrate 2 arranged opposite to each other. The OLED array as shown in FIG. 4, which is bi-directional light-emitting, is formed on one face of the first transparent substrate 3 facing the second transparent substrate 2, and the optical display array and the first optical film 4 are formed on the other face of the first transparent substrate 3. The optical display array is formed on one face of the second transparent substrate 2, and the second optical film 1 is formed the other face of the second transparent substrate 2 opposite to the first transparent substrate 3. The first optical film 4 and the second optical film 1 can be switched between a non-opaque status and an opaque status. The display panel are then formed by two transparent substrates adhered with optical films through a cell process.

As compared to common single-sided display, when the OLED display panel performs double-sided display, the driving circuit, after providing the data current signal according to the display data, is required to invert the data current signal and output the inverted data current signal to the data signal line, thereby to display one frame within two clock cycles.

At first, it is required to double the clock frequency. For example, if the frame frequency for frame transmission is 60 Hz, when for double-sized display, the clock cycle of the driving circuit is required to be set as 120 Hz. The same frame data signal is displayed within two clock cycles, where the first clock cycle is used for front display, while the second clock cycle is used for back display. The OLED display is achieved by controlling the OLED current passing therethrough. FIG. 5a is a schematic view showing the charging current during the front display of the OLED display panel, and FIG. 5b is a schematic view showing the charging current during the back display of the OLED display panel. If the back display intends to achieve an effect as front display, it is required to invert the current signal. As can be seen from FIGS. 5a and 5b, when the current signal desired for the front display is I00-Inn, the current signal desired to be added for the back display has the same row coordinates as that for the front display (0-n in FIGS. 5a and 5b), but has opposite column coordinates (i.e., 0-n in FIG. 5a and n-0 in FIG. 5b). Hence, when the back display is to be performed, it is unnecessary to invert the current signal of a gate line, and merely the data current signal needs to be varied. That is, within the first clock cycle, the data current signal is directly output to the data signal line of the OLED display panel, while within the second clock cycle, the data current signal is inverted, and the inverted data current signal is output to the data signal line.

To be specific, the data current signal may be inverted by processing the data current signal through logical operations, e.g., an XOR operation, or by processing the data current signal through software algorithms, or by changing scanning modes of the data signal line. For example, when the front display is required within the $n^{th}$ cycle of the data signal, the scanning mode of the data signal line is from left to right, i.e., S1-Sn, and when the back display is required within the $(n+1)^{th}$ cycle of a frame signal, the scanning mode of the data signal line is from right to left, i.e., Sn-S1. As a result, it is able to output the data current signals for both front and back display via the same driving circuit.

Further, the double-sided display of the OLED display panel also needs to switch the states of the optical films. For example, when the data signal line performs the scanning from S1 to Sn within the $n^{th}$ clock cycle and the scanning from Sn to S1 within the $(n+1)^{th}$ clock cycle, and the same frame data signal is added, the front and back images will be overlapped with each other, so it is required to separate the optical signals using optical films so as to achieve normal display. When the scanning from S1 to Sn is performed within the $n^{th}$ clock cycle for front display, the first optical film 4 is switched to the non-opaque status so as to allow the light to pass therethrough, and the second optical film 1 is switched to the opaque status so as to prevent the light from passing therethrough. When the scanning from Sn to S1 is performed within the $(n+1)^{th}$ clock cycle for the back display, the first optical film 4 is switched to the opaque status so as to prevent the light from passing therethrough, and the second optical film 1 is switched to the non-opaque status so as to allow the light to pass therethrough. At this time, the image can be merely seen from the second transparent substrate 2, and as a result, the back display is achieved.

According to the above-mentioned technical solutions, for the same frame data signal, within the first clock cycle, the data current signal is directly output to the data signal line of the OLED display panel, the first optical film 4 is switched to the non-opaque status, and the second optical film 1 is switched to the opaque status. While within the second clock cycle, the data current signal is inverted, the inverted data current signal is output to the data signal line, the first optical film 4 is switched to the opaque status, and the second optical film 1 is switched to the non-opaque status. As a result, it is able to achieve double-sized display of the OLED display panel.

The above are merely the preferred embodiments of this utility model. It should be noted that, a person skilled in the art may make improvements and modifications without departing from the principle of this utility model, and these improvements and modifications shall also be considered as the scope of this utility model.

What is claimed is:

1. An organic light emitting diode (OLED) display panel, comprising:
   a first transparent substrate and a second transparent substrate arranged opposite to each other;
   an OLED array formed on one face of the first transparent substrate facing the second transparent substrate, and an optical display array and a first optical film formed on the other face of the first transparent substrate; and
   a second optical film formed on one face of the second transparent substrate opposite to the first transparent substrate, and an optical display array formed on the other face of the second transparent substrate,
   wherein the first and second optical films can be switched between a non-opaque status and an opaque status;
   within a first clock cycle, a data signal line of the OLED display panel receives a data current signal, the first optical film is switched to the non-opaque status and the second optical film is switched to the opaque status; and
   within a second clock cycle, the data signal line of the OLED display panel receives an inverted data current signal, the first optical film is switched to the opaque status and the second optical film is switched to the non-opaque status.

2. The OLED display panel according to claim 1, wherein the optical display array on the second transparent substrate is formed on one face facing the first transparent substrate.

3. The OLED display panel according to claim 1, wherein the optical display array on the first transparent substrate and the second transparent substrate includes a black matrix.

4. The OLED display panel according to claim 1, wherein the optical display array on the first transparent substrate and the second transparent substrate further includes a color filter layer.

5. A driving circuit for the OLED display panel according to claim 1, comprising:
   a data signal providing module, configured to provide the data current signal according to display data;
   a controlling module, configured to, within the first clock cycle, directly output the data current signal to the data signal line of the OLED display panel and output a forward optical signal to a switching module, and within the second clock cycle, invert the data current signal, output the inverted data current signal to the data signal line, and output a backward optical signal to the switching module; and the switching module, configured to switch the first optical film to the non-opaque status and switch the second optical film to the opaque status when the forward optical signal is received, and to switch the first optical film to the opaque status and switch the second optical film to the non-opaque status when the backward optical signal is received.

6. The driving circuit for the OLED display panel according to claim 5, wherein the data current signal has a frequency twice a frame frequency for frame transmission of the OLED display panel.

7. The driving circuit for the OLED display panel according to claim 5, wherein the controlling module is specifically configured to output the data current signal to the data signal line after an XOR operation is performed on the data current signal within the second clock cycle, and/or to reverse a scanning sequence of the data current signal within the second clock cycle and then output the data current signal to the data signal line.

8. The driving circuit for the OLED display panel according to claim 5, wherein
in the OLED display panel, the optical display array on the second transparent substrate is formed on one face facing the first transparent substrate.

9. The driving circuit for the OLED display panel according to claim 5, wherein
in the OLED display panel, the optical display array on the first transparent substrate and the second transparent substrate includes a black matrix.

10. The driving circuit for the OLED display panel according to claim 5, wherein
in the OLED display panel, the optical display array on the first transparent substrate and the second transparent substrate further includes a color filter layer.

11. A driving method for the OLED display panel according to claim 1, comprising:

providing the data current signal according to display data; and within the first clock cycle, directly outputting the data current signal to the data signal line of the OLED display panel, switching the first optical film to the non-opaque status and switching the second optical film to the opaque status, and within the second clock cycle, inverting the data current signal, outputting the inverted data current signal to the data signal line, switching the first optical film to the opaque status, and switching the second optical film to the non-opaque status.

12. The driving method for the OLED display panel according to claim 11, wherein the data current signal has a frequency twice a frame frequency for frame transmission of the OLED display panel.

13. The driving method for the OLED display panel according to claim 11, wherein the inverting the data current signal within the second clock cycle comprises:
performing an XOR operation on the data current signal; and/or
reversing a scanning sequence of the data current signal.

14. The driving method for the OLED display panel according to claim 11, wherein
in the OLED display panel, the optical display array on the second transparent substrate is formed on one face facing the first transparent substrate.

15. The driving method for the OLED display panel according to claim 11, wherein
in the OLED display panel, the optical display array on the first transparent substrate and the second transparent substrate includes a black matrix.

16. The driving method for the OLED display panel according to claim 11, wherein
in the OLED display panel, the optical display array on the first transparent substrate and the second transparent substrate further includes a color filter layer.

* * * * *